(12) United States Patent
Bergendahl et al.

(10) Patent No.: US 9,449,871 B1
(45) Date of Patent: Sep. 20, 2016

(54) HYBRID AIRGAP STRUCTURE WITH OXIDE LINER

(71) Applicant: International Business Machines Corporation, Armonk, NY (US)

(72) Inventors: Marc A. Bergendahl, Troy, NY (US); James J. Demarest, Rensselaer, NY (US); Christopher J. Penny, Saratoga Springs, NY (US); Christopher J. Waskiewicz, Rexford, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/944,355

(22) Filed: Nov. 18, 2015

(51) Int. Cl.
  *H01L 21/768* (2006.01)
  *H01L 21/311* (2006.01)
  *H01L 21/3213* (2006.01)
  *H01L 21/027* (2006.01)
  *H01L 23/528* (2006.01)
  *H01L 23/532* (2006.01)

(52) U.S. Cl.
  CPC ....... *H01L 21/7682* (2013.01); *H01L 21/0276* (2013.01); *H01L 21/31111* (2013.01); *H01L 21/32133* (2013.01); *H01L 21/7684* (2013.01); *H01L 21/76802* (2013.01); *H01L 21/76831* (2013.01); *H01L 21/76834* (2013.01); *H01L 21/76843* (2013.01); *H01L 21/76877* (2013.01); *H01L 23/528* (2013.01); *H01L 23/53238* (2013.01); *H01L 23/53295* (2013.01)

(58) Field of Classification Search
  CPC .................... H01L 21/7682; H01L 21/76831; H01L 21/0276; H01L 21/31111; H01L 21/32133; H01L 21/76802; H01L 21/76804; H01L 21/76834; H01L 21/7684; H01L 21/76843; H01L 21/76877
  USPC ......................................... 438/619, 637–640
  See application file for complete search history.

(56) References Cited

U.S. PATENT DOCUMENTS

| | | |
|---|---|---|
| 5,001,079 A | 3/1991 | Van Laarhoven et al. |
| 5,324,683 A | 6/1994 | Fitch et al. |
| 5,407,860 A | 4/1995 | Stoltz et al. |
| 5,599,745 A | 2/1997 | Reinberg |
| 5,641,712 A | 6/1997 | Grivna et al. |
| 5,668,398 A | 9/1997 | Havemann et al. |
| 5,716,888 A | 2/1998 | Lur et al. |
| 5,728,628 A * | 3/1998 | Havemann ........ H01L 21/76831 257/E21.576 |
| 5,759,913 A | 6/1998 | Fulford, Jr. et al. |
| 5,776,828 A | 7/1998 | Givens |
| 5,792,706 A | 8/1998 | Michael et al. |
| 5,814,558 A | 9/1998 | Jeng et al. |
| 5,880,018 A | 3/1999 | Boeck et al. |
| 5,994,776 A | 11/1999 | Fang et al. |
| 6,025,260 A | 2/2000 | Lien et al. |
| 6,071,805 A | 6/2000 | Liu |
| 6,091,149 A | 7/2000 | Hause et al. |

(Continued)

*Primary Examiner* — Matthew Landau
*Assistant Examiner* — Grant Withers
(74) *Attorney, Agent, or Firm* — Cantor Colburn LLP; Vazken Alexanian

(57) ABSTRACT

A technique relates to an airgap structure. A dielectric layer is formed on an underlying layer. Copper filled trenches are formed in the dielectric layer, and a metal liner lines the copper filled trenches. An oxide liner lines the metal liner and covers the dielectric layer. One or more airgaps are formed between the copper filled trenches in areas in which the oxide liner was not present on the dielectric layer. A cap layer is formed on top of the one or more airgaps, the copper filled trenches, and portions of the oxide liner.

10 Claims, 10 Drawing Sheets

(56) References Cited

U.S. PATENT DOCUMENTS

| | | | |
|---|---|---|---|
| 6,261,942 B1 | 7/2001 | Zhou et al. | |
| 6,307,265 B1 * | 10/2001 | Anand | H01L 21/7682 |
| | | | 257/522 |
| 6,509,623 B2 | 1/2003 | Zhao | |
| 7,259,441 B2 | 8/2007 | Pamler et al. | |
| 7,534,696 B2 | 5/2009 | Jahnes et al. | |
| 7,608,909 B2 | 10/2009 | Chinthakindi et al. | |
| 7,671,442 B2 | 3/2010 | Anderson et al. | |
| 7,741,228 B2 * | 6/2010 | Ueki | H01L 21/7682 |
| | | | 257/E21.573 |
| 7,768,130 B2 | 8/2010 | Hsu et al. | |
| 7,790,601 B1 | 9/2010 | Choi et al. | |
| 7,816,279 B2 * | 10/2010 | Sunayama | H01L 21/2855 |
| | | | 257/E21.006 |
| 7,892,940 B2 | 2/2011 | Edelstein et al. | |
| 8,030,202 B1 | 10/2011 | Horak et al. | |
| 8,084,352 B2 * | 12/2011 | Harada | H01L 21/7682 |
| | | | 257/E21.577 |
| 8,129,286 B2 | 3/2012 | Edelstein et al. | |
| 8,299,455 B2 | 10/2012 | Doris et al. | |
| 8,304,906 B2 * | 11/2012 | Huang | H01L 21/7682 |
| | | | 257/750 |
| 8,343,868 B2 | 1/2013 | Edelstein et al. | |
| 8,399,350 B2 | 3/2013 | Nogami et al. | |
| 8,569,165 B2 * | 10/2013 | Gordon | C23C 16/18 |
| | | | 257/E21.575 |
| 8,575,000 B2 | 11/2013 | Purayath et al. | |
| 8,653,663 B2 * | 2/2014 | Kao | H01L 23/53238 |
| | | | 257/744 |
| 8,685,809 B2 | 4/2014 | Doris et al. | |
| 8,847,396 B2 | 9/2014 | Huang et al. | |
| 9,153,479 B2 * | 10/2015 | Ting | H01L 21/76883 |
| 9,153,498 B2 * | 10/2015 | Xie | H01L 29/6653 |
| 9,281,277 B2 * | 3/2016 | Baek | H01L 23/53238 |
| 9,305,836 B1 * | 4/2016 | Gates | H01L 21/28556 |
| 9,330,963 B2 * | 5/2016 | King | H01L 21/76802 |
| 9,337,150 B2 * | 5/2016 | Han | H01L 23/53295 |
| 9,343,294 B2 * | 5/2016 | Chi | H01L 21/76802 |
| 2006/0183315 A1 | 8/2006 | Dimitrakopoulos et al. | |
| 2008/0026541 A1 | 1/2008 | Edelstein et al. | |
| 2008/0122106 A1 | 5/2008 | Nitta et al. | |
| 2009/0140428 A1 | 6/2009 | Bonilla et al. | |
| 2011/0108992 A1 | 5/2011 | Chanda et al. | |
| 2011/0111590 A1 | 5/2011 | Edelstein et al. | |
| 2011/0193230 A1 | 8/2011 | Nogami et al. | |
| 2011/0266682 A1 | 11/2011 | Edelstein et al. | |
| 2012/0104512 A1 | 5/2012 | Horak et al. | |
| 2012/0104619 A1 | 5/2012 | Ponoth et al. | |
| 2012/0111825 A1 | 5/2012 | Chanda et al. | |
| 2012/0187566 A1 | 7/2012 | Horak et al. | |
| 2012/0187567 A1 | 7/2012 | Lee et al. | |
| 2012/0329267 A1 | 12/2012 | Horak et al. | |
| 2013/0026635 A1 | 1/2013 | Yang et al. | |
| 2013/0065376 A1 | 3/2013 | Horak et al. | |
| 2013/0134590 A1 | 5/2013 | Nogami et al. | |
| 2014/0008804 A1 | 1/2014 | Purayath et al. | |
| 2015/0162277 A1 | 6/2015 | Zhang et al. | |
| 2015/0170956 A1 | 6/2015 | Naik et al. | |

* cited by examiner

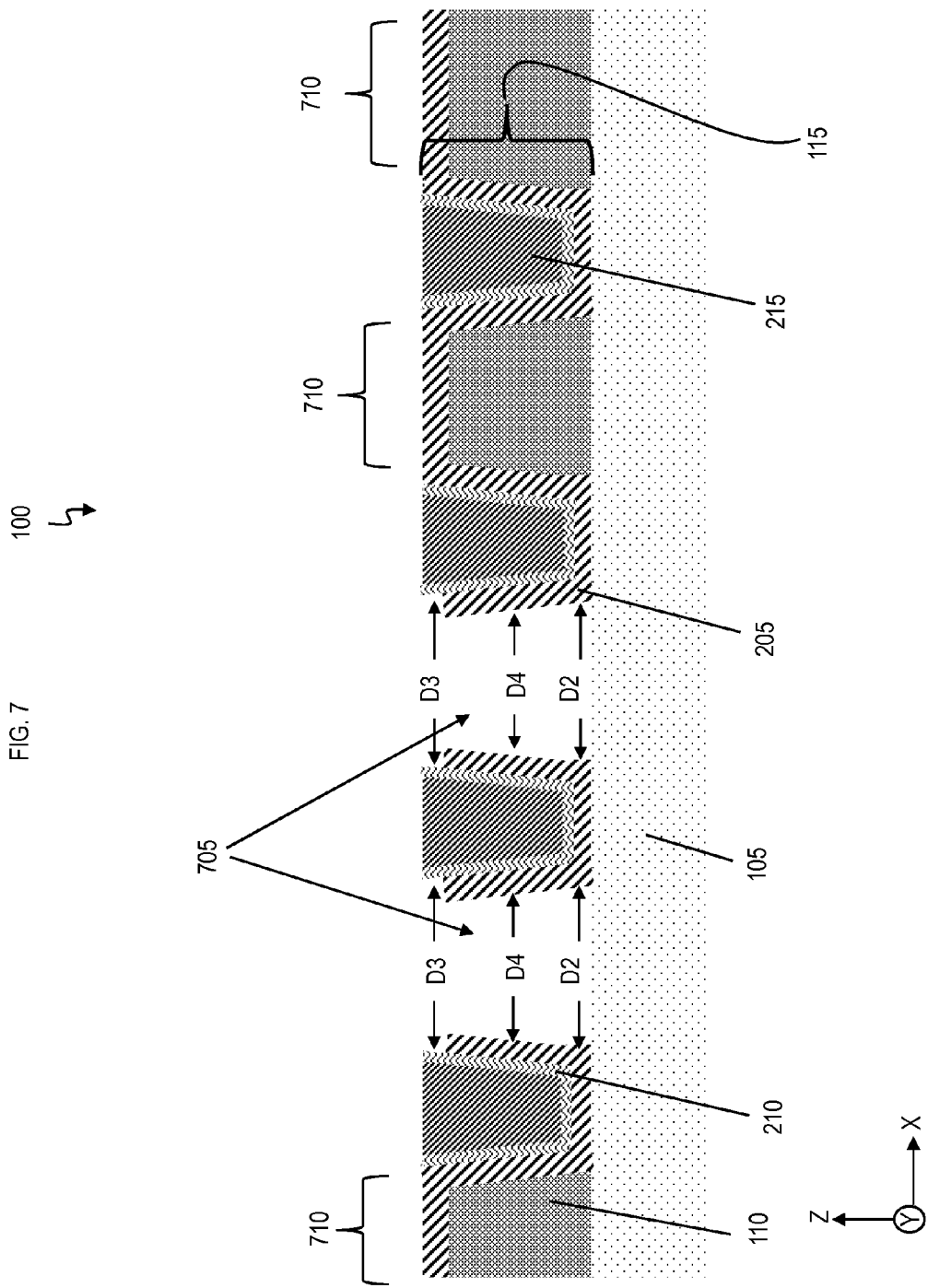

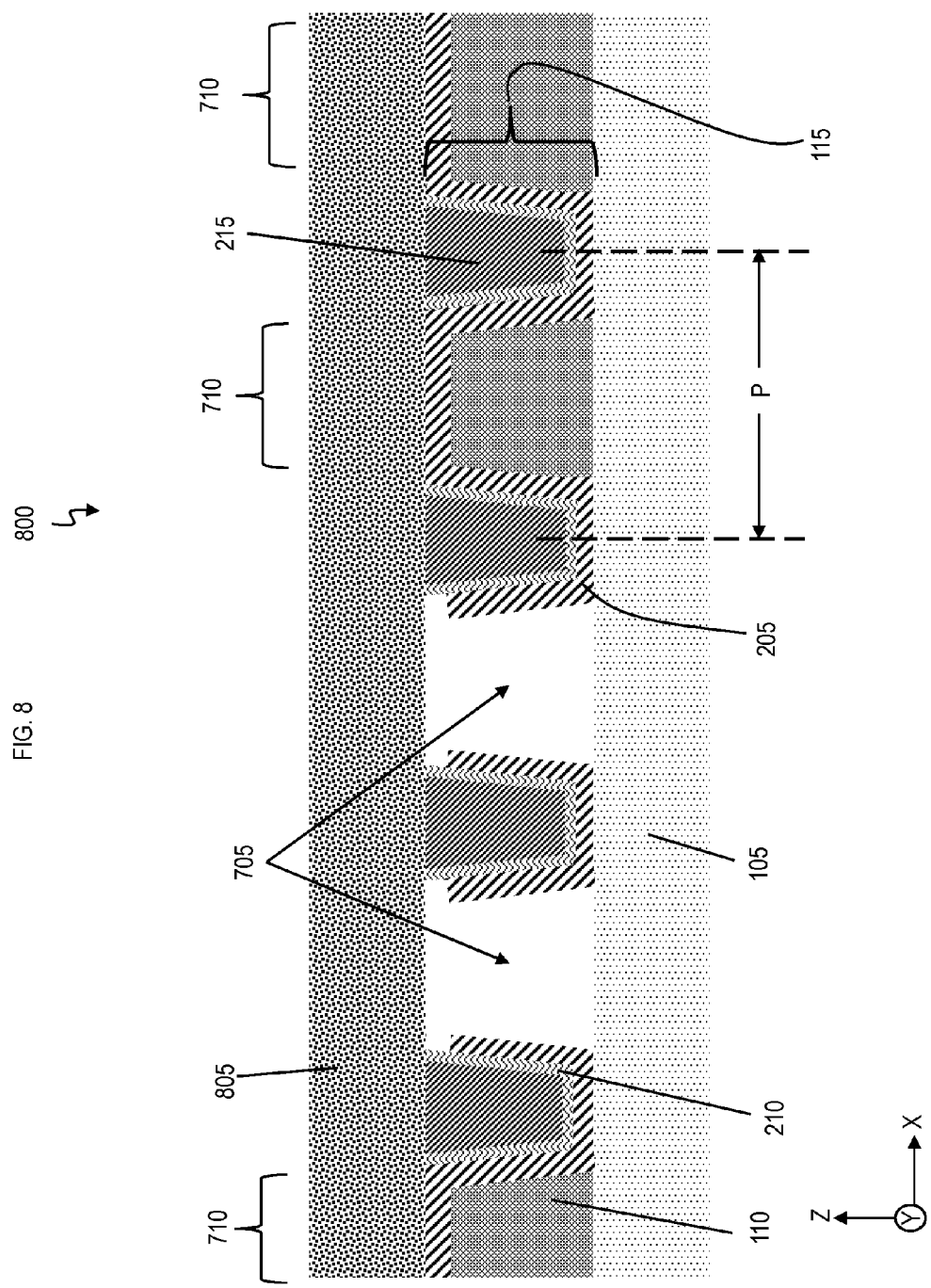

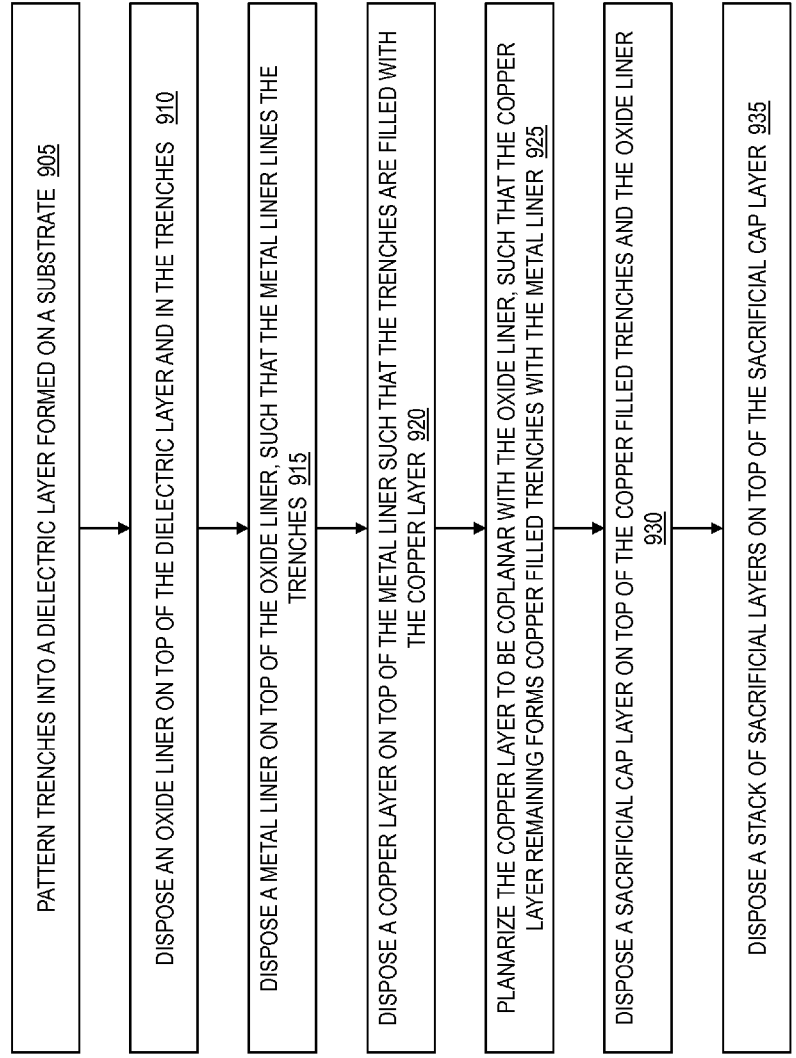

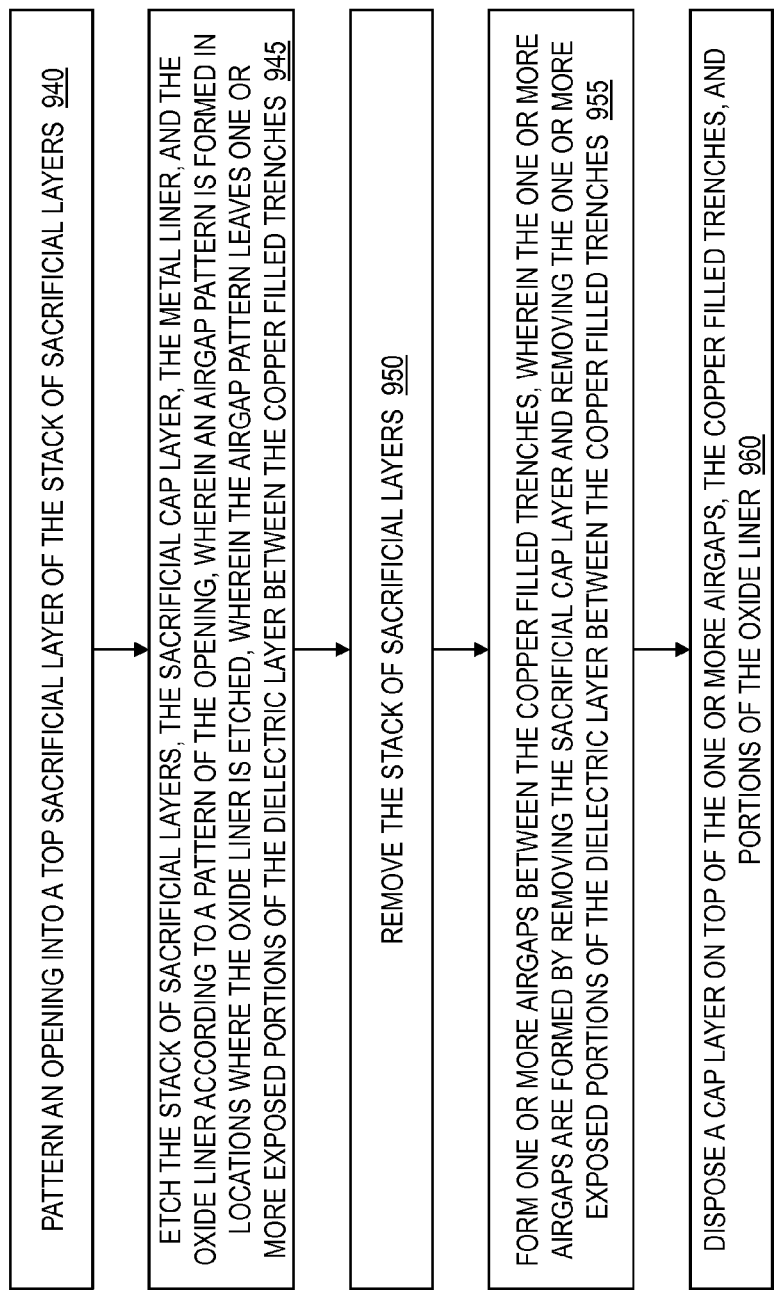

HYBRID AIRGAP STRUCTURE WITH OXIDE LINER

BACKGROUND

The present invention relates to semiconductors, and more specifically, to forming a hybrid airgap structure with oxide liner.

The back end of line (BEOL) is the second portion of integrated circuit fabrication where the individual devices (transistors, capacitors, resistors, etc.) get interconnected with wiring on the wafer. BEOL generally begins when the first layer of metal is deposited on the wafer. BEOL includes contacts, insulating layers (dielectrics), metal levels, and bonding sites for chip-to-package connections.

SUMMARY

According to one embodiment, a method of forming an airgap structure is provided. The method includes patterning trenches into a dielectric layer formed on an underlying layer, disposing an oxide liner on top of the dielectric layer and in the trenches, disposing a metal liner on top of the oxide liner, such that the metal liner lines the trenches, disposing a copper layer on top of the metal liner such that the trenches are filled with the copper layer, and planarizing the copper layer to be coplanar with the oxide liner, such that the copper layer remaining forms copper filled trenches with the metal liner. Also, the method includes disposing a first cap layer on top of the copper filled trenches and the oxide liner, where the first cap layer is a sacrificial or permanent cap layer, disposing a stack of sacrificial layers on top of the first cap layer, patterning an opening into a top sacrificial layer of the stack of sacrificial layers, etching the stack of sacrificial layers, the first cap layer, the metal liner, and the oxide liner according to a pattern of the opening, where an airgap pattern is formed in locations where the oxide liner is etched, and where the airgap pattern leaves one or more exposed portions of the dielectric layer between the copper filled trenches. Further, the method includes removing the stack of sacrificial layers, forming one or more airgaps between the copper filled trenches, where the one or more airgaps are formed by removing the one or more exposed portions of the dielectric layer between the copper filled trenches, and disposing a second cap layer on top of the one or more airgaps, the copper filled trenches, and portions of the oxide liner.

According to one embodiment, an airgap structure is provided. A dielectric layer is formed on an underlying layer. Copper filled trenches are formed in the dielectric layer, and a metal liner lines the copper filled trenches, where an oxide liner lines the metal liner and covers the dielectric layer. One or more airgaps are formed between the copper filled trenches in areas in which the oxide liner was not present on the dielectric layer. A cap layer is formed on top of the one or more airgaps, the copper filled trenches, and portions of the oxide liner.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

FIG. 7 is a cross-sectional view illustrating dielectric extraction in the intermediate structure according to an embodiment.

FIG. 8 is a cross-sectional view of a resultant hybrid airgap structure according to an embodiment.

FIGS. 9A and 9B together are a flow chart of a method of forming an airgap structure according to an embodiment.

DETAILED DESCRIPTION

Embodiments provide an integrated method for airgap formation. Embodiments allow the area where the airgaps are formed to be controlled, while limiting the negative impacts of the processes associated with forming airgaps.

Embodiments improve on methods and structures by providing protection for copper lines. Additionally, embodiments provide a means for controlling the structures or areas on a chip where the airgaps are formed. Embodiments describe a hybrid dielectric structure surrounding interconnect lines, where a top layer can be dissolved and removed. One feature is the use of an oxide or similar liner material in the trench to both protect the copper lines and provide a means to control the area where the airgaps are formed.

Figure 1:
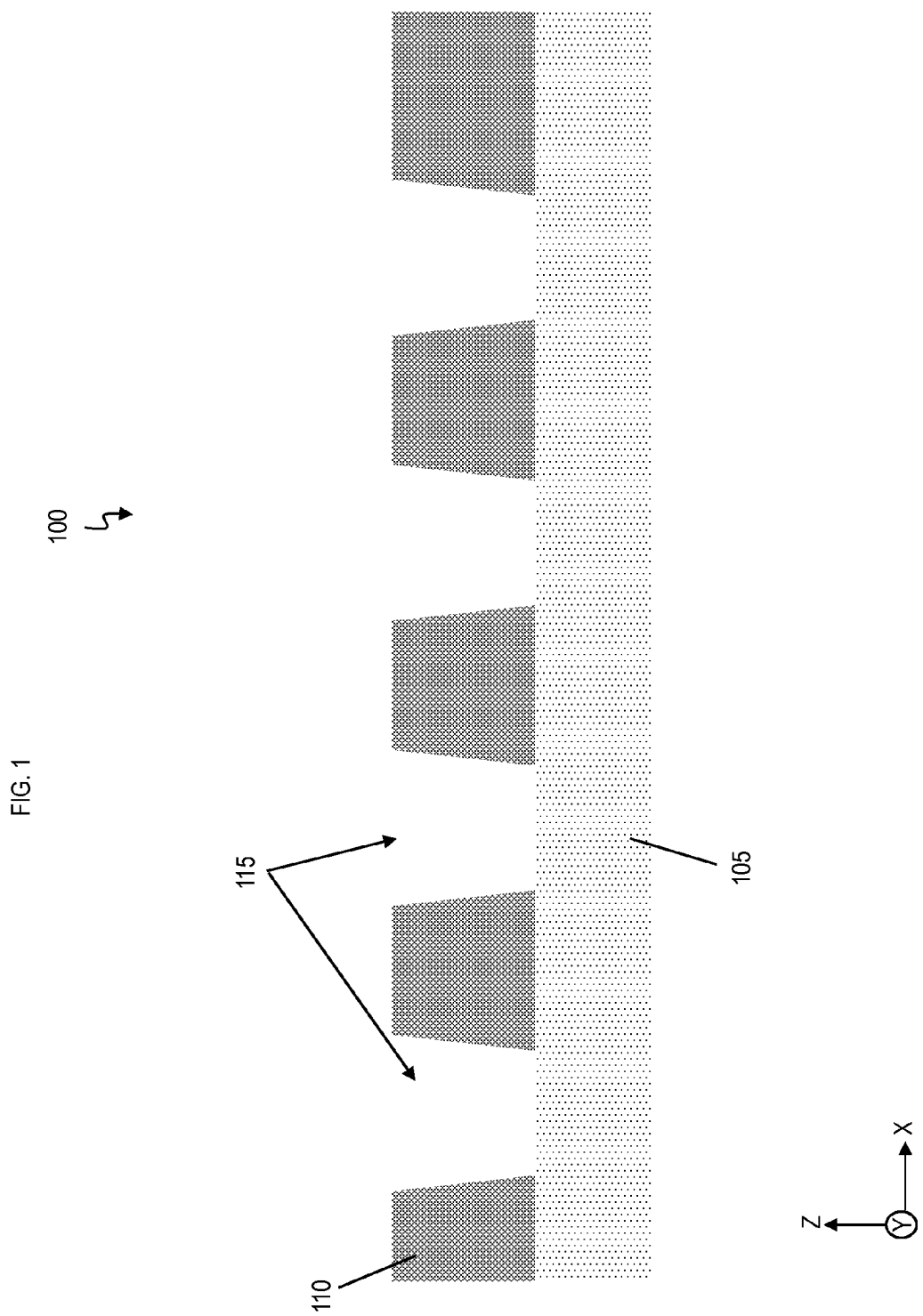
FIG. 1 is a cross-sectional view of an intermediate structure according to an embodiment.

Now turning to the figures, FIGS. 1-8 illustrate a schematic of fabricating a hybrid airgap structure according to an embodiment. FIG. 1 is a cross-sectional view of an intermediate structure 100 according to an embodiment. The intermediate structure 100 includes an underlying layer 105. The underlying layer 105 may be a non-extractable dielectric for vias (i.e., holes). Examples of material for the underlying layer 105 may include SiCOH (silicon carbon oxygen hydrogen), $SiO_2$, SiCN, SiOC, and/or Si. A dielectric layer 110 is disposed on top of the underlying layer 105. Trenches 115 are formed in the dielectric layer 110. The dielectric layer 110 is an extractable dielectric material for trenches. Examples of the dielectric material for the dielectric layer 110 may include nitrides, SiCOH, and/or similar material chosen to be selectively removable to the underlying layer 105. In one implementation, the dielectric layer 110 may have a thickness in the z-axes that ranges from about 25-200 nm.

Lithography and etching may be utilized to pattern the trenches 115. As one example, a photoresist layer may be deposited on the dielectric layer 110 and the photoresist may be patterned into the pattern for the trenches 115. Using the photoresist, the dielectric layer 110 is etched into the trenches 115, and the photoresist layer is removed. The trenches 115 extend in the y-axes.

Figure 2:
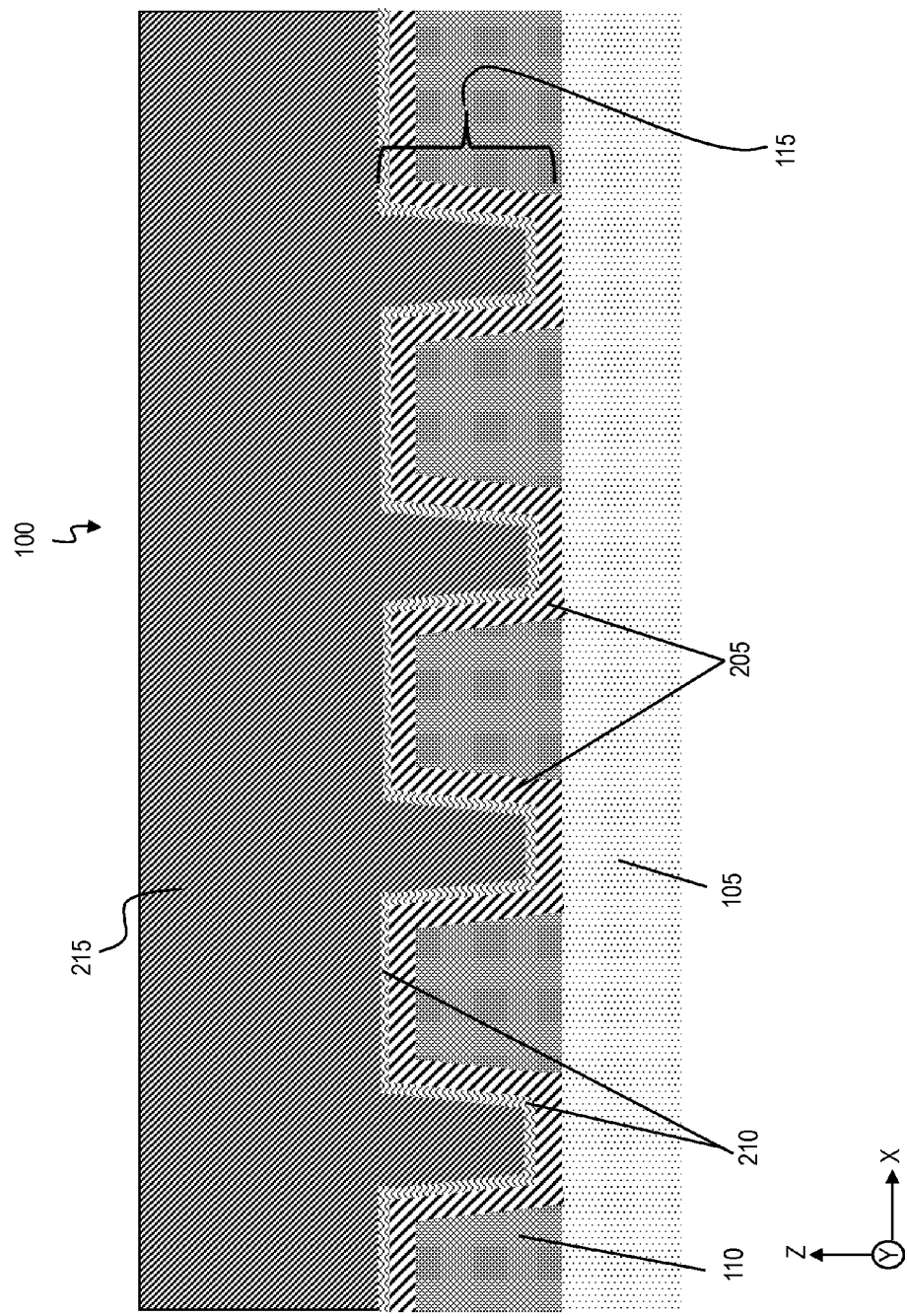
FIG. 2 is a cross-sectional view illustrating a metal layer disposed on top of the intermediate structure according to an embodiment.

FIG. 2 is a cross-sectional view illustrating disposing a metal layer 215 on top of the intermediate structure 100. In FIG. 2, an oxide layer 205 may be disposed on top of the intermediate structure 100, such that the oxide layer 205 covers the dielectric layer 110, the trenches 115, and the exposed underlying layer 105 in the trenches 115. The oxide layer 205 serves as an oxide liner that is to protect certain supporting areas of the dielectric layer 110, when the airgap is formed (as discussed further below). Example materials of the oxide layer 205 may include silicon dioxide, aluminum oxide, zinc oxide, etc. In one implementation, the thickness in the z-axes of the oxide layer 205 may range from about 5-10 nm.

A barrier layer 210 may be disposed on top of the oxide layer 205. The barrier layer 210 is configured to prevent interaction between the patterned dielectric layer 110 and a metal layer 215. Examples of the barrier layer 210 may include tantalum, tantalum nitride, titanium nitride, cobalt, ruthenium, manganese, and/or any combination thereof. The barrier layer 210 may have a thickness in the z-axes that ranges from about 1-10 nm.

As one example, the oxide layer 205 and/or the barrier layer 210 may be disposed using chemical vapor deposition (CVD), plasma enhanced chemical vapor deposition (PCVD), atomic layer deposition (ALD), plasma enhanced atomic layer deposition (PEALD), etc.

The metal layer 215 is disposed on top of the barrier layer 210. In one implementation, the metal layer 215 may be copper, a copper alloy, aluminum, aluminum alloy or other conductor. A (uniform) copper seed layer may be disposed on top of the barrier layer 210, and the metal layer 215 (e.g., copper) may be disposed using electroplating, also called electrochemical deposition (ECD), to cover the surface of the intermediate structure 100. The metal layer 215 fills the trenches 115.

Figure 3:
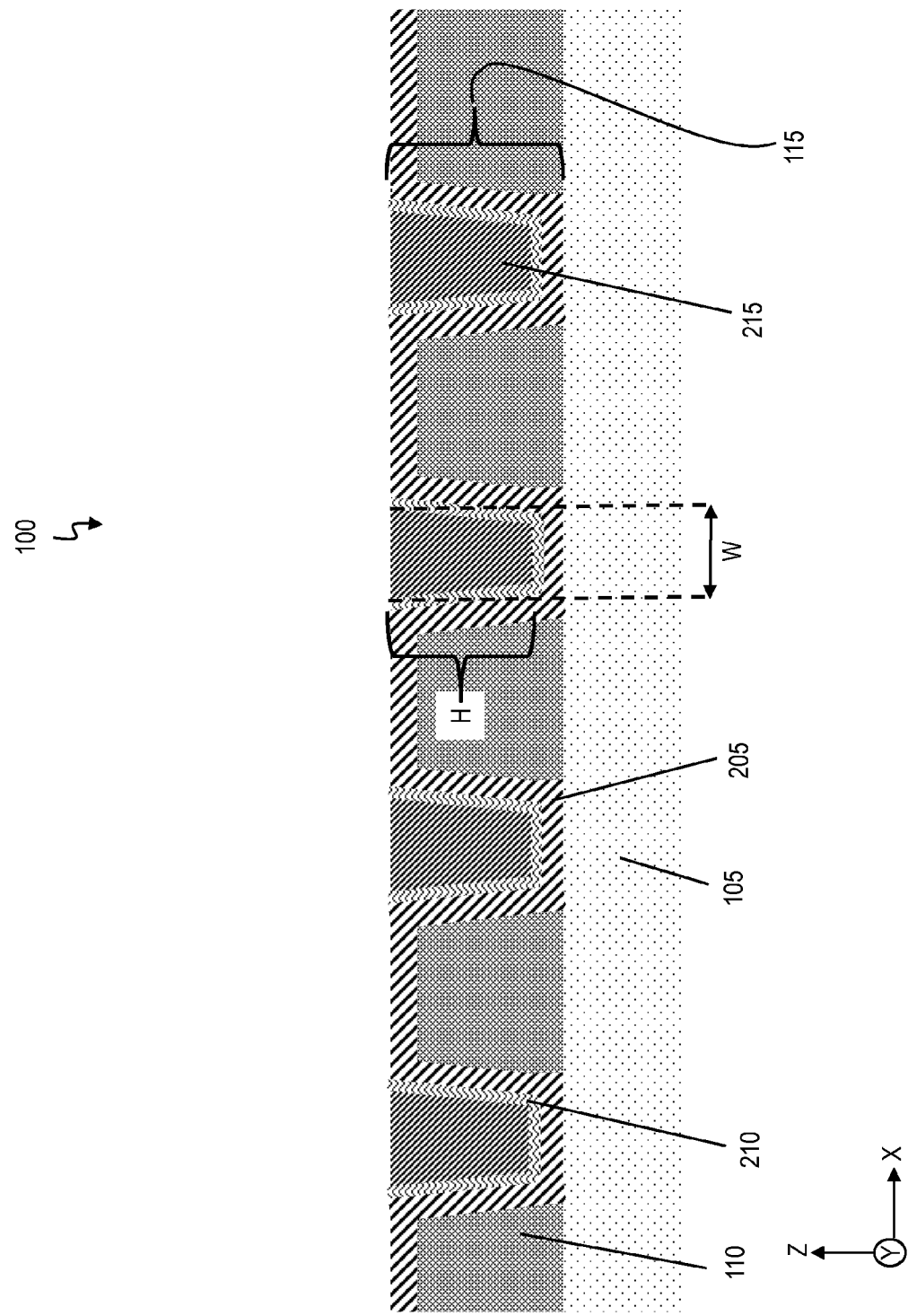
FIG. 3 is a cross-sectional view illustrating post metallization and planarization of the intermediate structure according to an embodiment.

FIG. 3 is a cross-sectional view illustrating post metallization and planarization of the intermediate structure 100 according to an embodiment. Chemical mechanical planarization/polishing may be performed to planarize the metal layer 215 leaving the trenches 115 filled, and to remove the horizontal layer of barrier layer 210. The top surface of the intermediate structure 100 is a smooth surface. As can be seen, the planarization does not remove the horizontal layer of the oxide layer 205.

In one implementation, the height H (in the z-axes) of the metal layer 215 filling the trench 115 should be twice the width W (in the x-axes) of the metal layer 215 filling the trench 115. For example, if the width W is about 25 nm, then the height H should be at least 50 nm.

Figure 4:
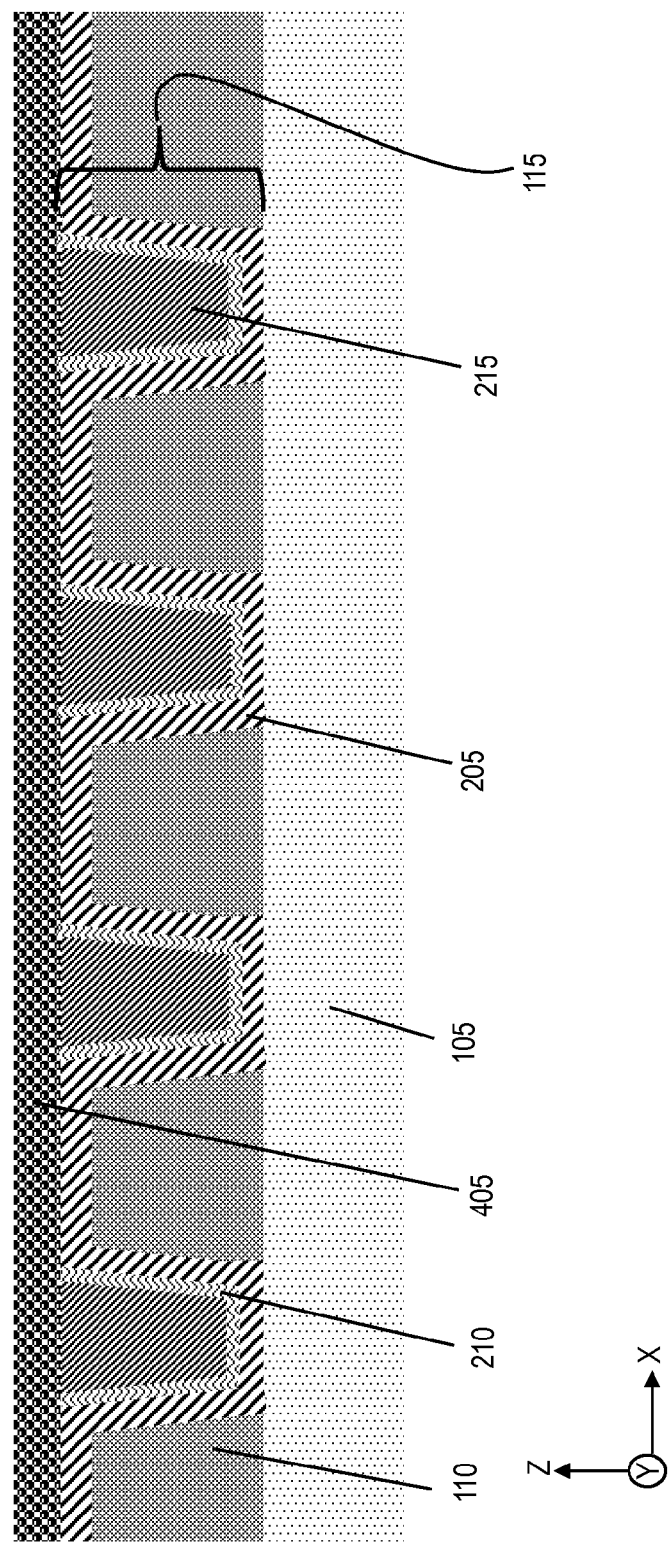
FIG. 4 is a cross-sectional view illustrating a sacrificial cap layer disposed on top of the intermediate structure according to an embodiment.

FIG. 4 is a cross-sectional view illustrating that a sacrificial cap layer 405 is disposed on top of the intermediate structure 100 according to an embodiment. The sacrificial cap layer 405 covers the oxide layer 205, the barrier layer 210, and the metal layer 215 filling the trenches 115. Examples of the sacrificial cap layer 405 may include silicon nitride, SiCN, and/or similar. In another embodiment, this first cap layer 405 is not sacrificial.

Figure 5:
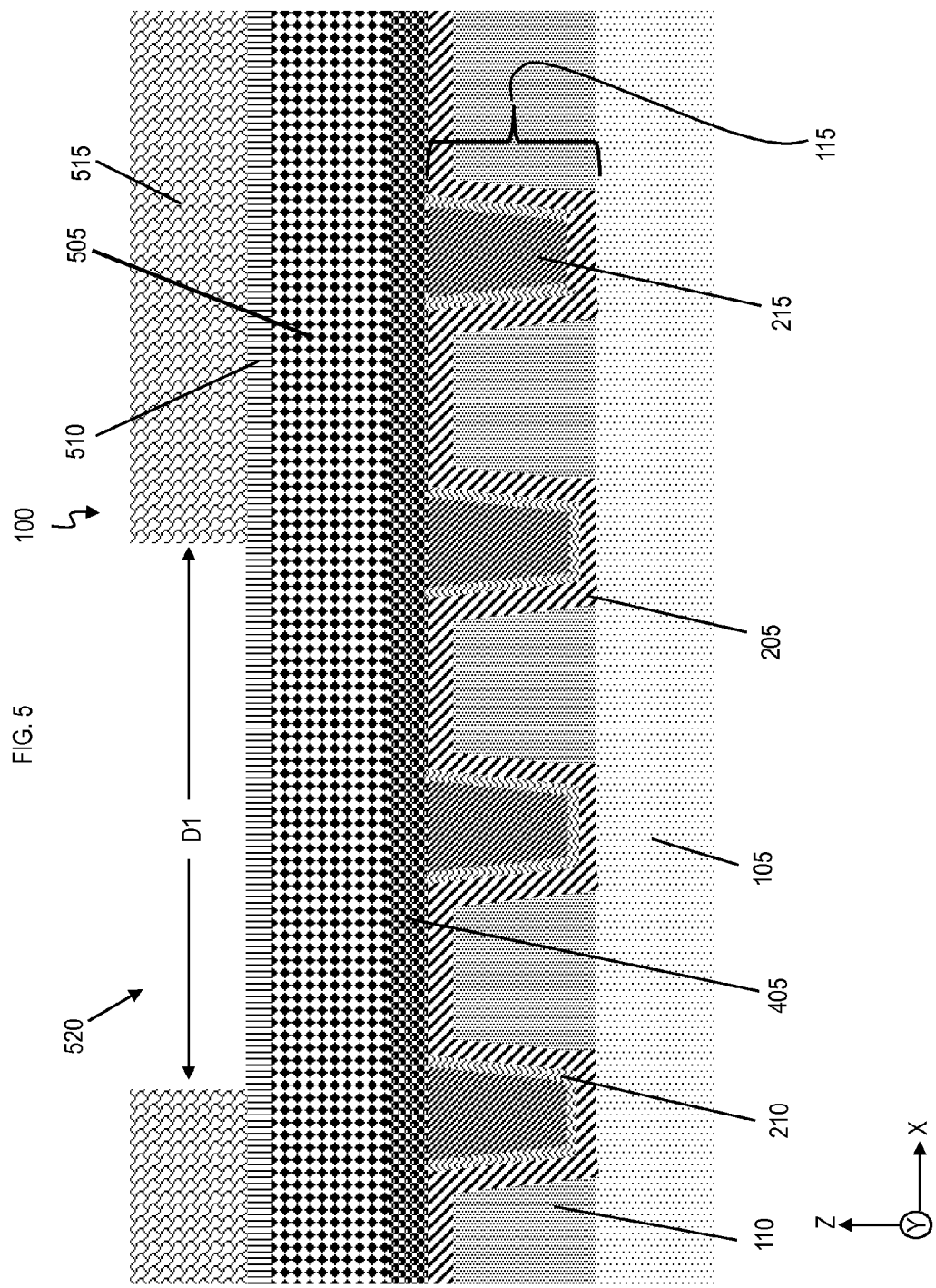
FIG. 5 is a cross-sectional view illustrating other sacrificial layers disposed on top of the intermediate structure for patterning according to an embodiment.

FIG. 5 is a cross-sectional view illustrating that other sacrificial layers are disposed on top of the intermediate structure 100 for patterning according to an embodiment.

An organic planarization/planarizing layer (OPL) 505 is disposed on top of the sacrificial cap layer 405 to cover the intermediate structure 100. An antireflective coating layer 510 is disposed on top of the organic planarization layer 505 to cover the intermediate structure 100. A photoresist layer 515 is disposed on top of the antireflective coating layer 510 to cover the intermediate structure 100. The photoresist layer 515 is patterned/etched to create an opening 520. The opening 520 may have a distance D1 (e.g., a diameter or width in the x-axes) that is etched into the photoresist layer 515. In one implementation, the distance D1 may range from about 50 nm to greater than 1 micron (μm).

The OPL 505 may include a photo-sensitive organic polymer comprising a light-sensitive material that, when exposed to electromagnetic (EM) radiation, is chemically altered and thus configured to be removed using a developing solvent. For example, the photo-sensitive organic polymer of the OPL 505 may be include polyacrylate resin, epoxy resin, phenol resin, polyamide resin, polyimide resin, unsaturated polyester resin, polyphenylenether resin, polyphenylenesulfide resin, and/or benzocyclobutene (BCB). More generally, for example, the OPL 505 may comprise any organic polymer and a photo-active compound having a molecular structure that can attach to the molecular structure of the organic polymer. The OPL 505 may, for example, be applied using spin coating technology or other techniques. The fabrication of a photo-sensitive organic polymer is understood by one skilled in the art.

Furthermore, the antireflective coating layer 510 may have material properties suitable for use as an antireflective coating. Additionally, the antireflective coating layer 510 comprises a light-sensitive material that, when exposed to electromagnetic (EM) radiation, is chemically altered and thus configured to be removed using a developing solvent. For example, the antireflective coating layer 510 may comprise (wet) developable antireflective coatings. The antireflective coating layer 510 may, for example, be applied using spin coating technology or other techniques.

Figure 6:
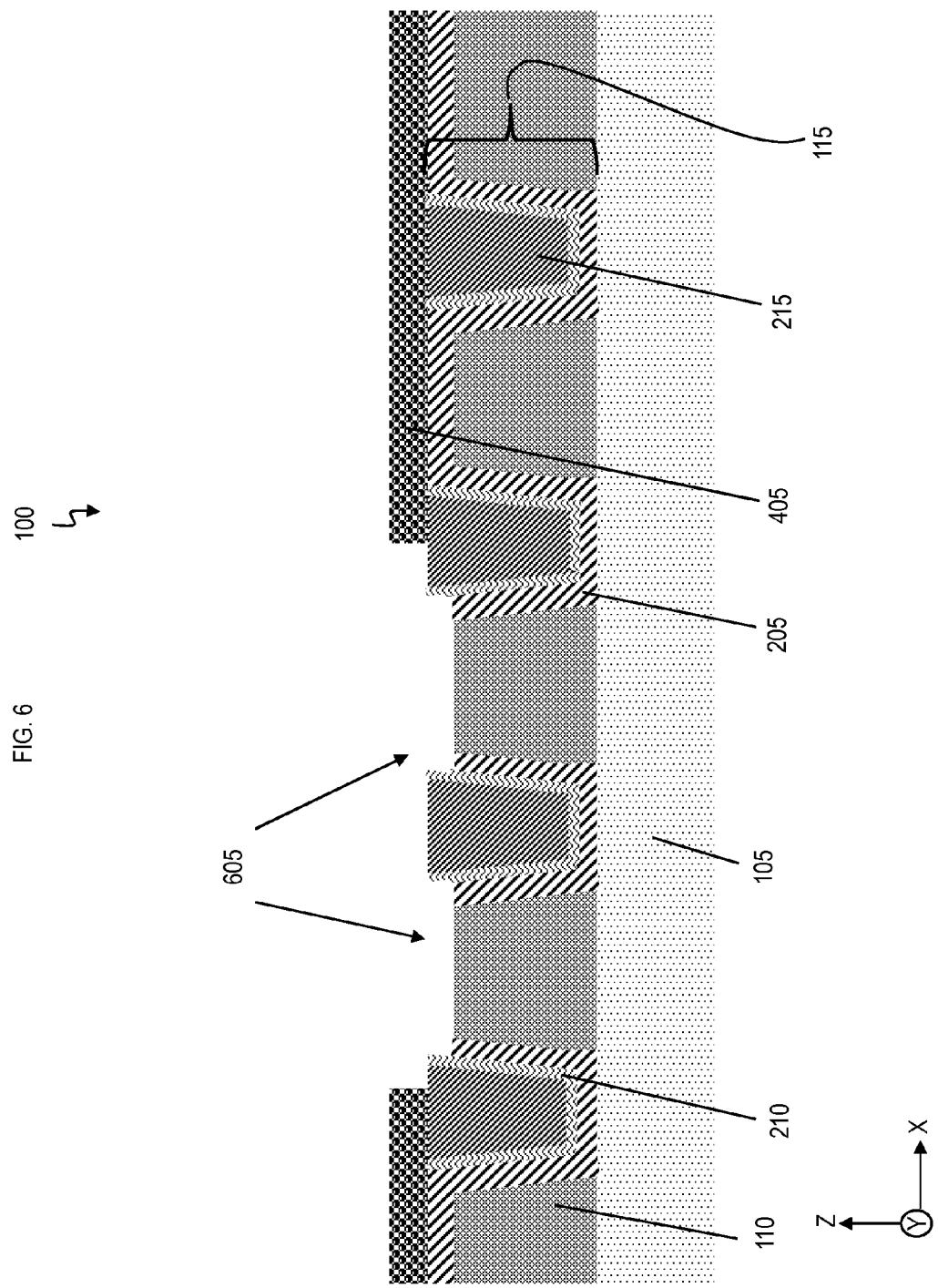
FIG. 6 is a cross-sectional view illustrating airgap patterning in the intermediate structure according to an embodiment.

FIG. 6 is a cross-sectional view illustrating an airgap patterning etch in the intermediate structure 100 according to an embodiment. Etching is performed to pattern airgap patterns/regions 605 in the desired areas, using the opening 520 in the photoresist layer 515 as the pattern location (in FIG. 5). Under the opening 520, the etching removes the antireflective coating layer 510, the organic planarization layer 505, the sacrificial cap layer 405, and the oxide layer 205. In one implementation, a plasma etch may be performed to remove the layers under the opening 520 to create the airgap pattern 605. Additionally, the etching causes portions of the oxide layer 205 to be coplanar with the dielectric layer 110 in the airgap pattern 605. In the airgap pattern 605, the metal layer 215 and the barrier layer 210 extend vertically in the z-axes above the coplanar layers 110, 205.

Once the airgap pattern 605 has been etched, the remaining antireflective coating layer 510, organic planarization layer 505, and sacrificial cap layer 405 are removed or stripped off. These layers may be removed by a dry or wet etch removal process as known by those skilled in the art and as defined by their specific nature and selection.

FIG. 7 is a cross-sectional view illustrating dielectric extraction in the intermediate structure 100 according to an embodiment. Portions of the dielectric layer 110 are removed in the areas (i.e., the airgap pattern 605) where the oxide layer 205 has been removed, thereby creating airgaps 705 only in specific regions. The airgaps 705 are controllably created according to the removal of the oxide layer 205 from the dielectric layer 110. Also, in one embodiment, the sacrificial cap layer 405 is removed. In another embodiment, the cap layer 405 is not removed.

In the case when the sacrificial cap layer 405 is removed, the etchant is selective to remove the dielectric layer 110 (and sacrificial cap layer 405) but not the oxide layer 205 and the barrier layer 210. In one implementation, a dilute hydrofluoric acid (DHF) solution may be used, and the dielectric layer 110 and sacrificial cap layer 405 are selected to have very high etch rates in DHF, while the oxide layer 205 and underlying layer 105 are relatively resistant to etching in DHF.

In FIG. 6, the horizontal oxide layer 205 (previously covering portions of the dielectric layer 110) was removed such that the airgaps 705 can be generated between the metal layers 215 filling the trenches 115. No airgaps are created in the areas where the oxide layer 205 still protects the underlying dielectric layer 110. By having the protective oxide layer 205 horizontally protecting the underlying dielectric layer 110, this leaves supporting structures 710 of the dielectric layer 110 in the areas protected by the oxide layer 205. The support structures 710 also hold up the cap layer (in FIG. 8), thereby avoiding dipping points in the cap layer (FIG. 8).

At the base of the airgap 705, the distance D2 in the x-axis of the airgap 705 may range from about 25-200 nm. At the top of the airgap, the distance D3 in the x-axis of the airgap 705 may range from about 25-200 nm. The middle part (defined by distance D4) of the airgap 705 may or may not be smaller than the distance D2 and the distance D3.

FIG. 8 is a cross-sectional view of a resultant hybrid airgap structure 800 according to an embodiment. The hybrid airgap structure 800 has a sealing cap layer 805 (which is the second cap layer) disposed on top of the oxide layer 205, the barrier layer 210, and the metal layer 215 filling the trenches 115. The sealing cap layer 805 covers (seals) the airgaps 705, and another level (e.g., another hybrid airgap structure 800) can be built on top of the sealing cap layer 805. The supporting structures 710 of dielectric material 110 help to hold up (i.e., support) the sealing layer cap 805 and other layers (not shown) on top of the sealing cap layer 805. FIG. 8 depicts one possible configuration for the sealing cap layer 805 and airgap 705, but the specific shape of the interface between the airgap 705 and the sealing cap layer 805 may vary depending on the material selected for the sealing cap layer 805. In one implementation, a SiCN cap layer is chosen and the airgap 705 has a peak in the z-axis between the metal lines 215. The metal 215 (copper) filled trenches 115 are interconnects. Through vias can be formed through the underlying layer 105 and connect to the metal filed trenches 115.

It should be appreciated that although two trenches of airgaps 705 are depicted more or fewer airgaps may be formed. Also, formation of the airgaps 705 is controlled to be within the location of the airgap pattern 605, and no airgaps are formed outside of the airgap pattern 605.

FIGS. 9A and 9B together are a flow chart 900 of a method of forming an airgap structure 800 according to an embodiment.

At block 905, trenches 115 are patterned into the dielectric layer 110 that is on top of the underlying layer 105, as depicted in FIG. 1.

At block 910, an oxide liner 205 is disposed on top of the dielectric layer 110 and in the trenches 115, as depicted in FIG. 2.

At block 915, a metal liner 210 is disposed on top of the oxide liner 205, such that the metal liner 210 lines the trenches 115, as depicted in FIG. 2.

At block 920, the copper layer 215 is disposed on top of the metal liner 210 such that the trenches 115 are filled with the copper layer 215, as depicted in FIG. 2.

At block 925, the copper layer 215 is planarized to be coplanar with the oxide liner 205 on top of the dielectric layer 110, such that the copper layer 215 remaining forms copper filled trenches 115 with the metal liner 210, as depicted in FIG. 3.

At block 930, the first cap layer 405 (which may be a sacrificial cap layer or a permanent cap layer) is disposed on top of the copper filled trenches 115 and the oxide liner 205, as depicted in FIG. 4.

At block 935, a stack of sacrificial layers (e.g., the organic planarization layer (OPL) 505, antireflective coating layer 510, photoresist layer 515) are disposed on top of the first cap layer 405, as depicted in FIG. 5.

Disposing the stack of sacrificial layers on top of the sacrificial cap layer comprises disposing a bottom sacrificial layer (the organic planarization layer (OPL) 505) on top of the first cap layer 405, disposing a middle sacrificial layer (antireflective coating layer 510) on top of the bottom sacrificial layer, and disposing the top sacrificial layer (photoresist layer 515) on top of the middle sacrificial layer. Removing the stack of sacrificial layers comprises removing the bottom, middle, and top sacrificial layers.

The bottom sacrificial layer is an organic planarization layer. The middle sacrificial layer is an anti-reflective coating. The top sacrificial layer is a photoresist layer.

At block 940, the opening 520 is patterned into a top sacrificial layer (photoresist layer 515) of the stack of sacrificial layers, as depicted in FIG. 5.

At block 945, the stack of sacrificial layers 505, 510, 515, the first cap layer 405, and the oxide liner 205 are etched according to a pattern of the opening 520, where an airgap pattern 605 is formed in locations where the oxide liner 205 is etched (away), where the airgap pattern 605 leaves one or more exposed portions of the dielectric layer 110 between the copper filled trenches 115, as depicted in FIG. 6. The exposed portions of the dielectric layer 110 are no longer covered with the oxide liner 205.

At block 950, the stack of sacrificial layers 505, 510, 515 are removed.

At block 955, one or more airgaps 705 are formed between the copper filled trenches 115, where the one or more airgaps 705 are formed by removing the first cap layer 405 and removing the one or more exposed portions of the dielectric layer 110 (in the airgap pattern 605) between the copper filled trenches 115, as depicted in FIG. 7.

At block 960, disposing the second cap layer 805 on top of the one or more airgaps 705, the copper filled trenches 115, and portions of the oxide liner 210.

Non-exposed portions of the dielectric layer 110 remain after the airgap pattern 605 is formed. The non-exposed portions (i.e., supporting structures 710) of the dielectric layer 110 support the second cap layer 805. The non-exposed portions of the dielectric layer 110 have the oxide liner 205 on top. The one or more airgaps 705 have sidewalls formed of the oxide liner 205.

It will be noted that various microelectronic device fabrication methods may be utilized to fabricate the components/elements discussed herein as understood by one skilled in the art. In semiconductor device fabrication, the various processing steps fall into four general categories: deposition, removal, patterning, and modification of electrical properties.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others.

Removal is any process that removes material from the wafer: examples include etch processes (either wet or dry), and chemical-mechanical planarization (CMP), etc.

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography.

Modification of electrical properties may include doping, such as doping transistor sources and drains, generally by diffusion and/or by ion implantation. These doping processes are followed by furnace annealing or by rapid thermal annealing (RTA). Annealing serves to activate the implanted dopants.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming an airgap structure, the method comprising:
   patterning trenches into a dielectric layer formed on an underlying layer;
   disposing an oxide liner on top of the dielectric layer and in the trenches;
   disposing a metal liner on top of the oxide liner, such that the metal liner lines the trenches;
   disposing a copper layer on top of the metal liner such that the trenches are filled with the copper layer;
   planarizing the copper layer to be coplanar with the oxide liner, such that the copper layer remaining forms copper filled trenches with the metal liner;
   disposing a first cap layer on top of the copper filled trenches and the oxide liner, wherein the first cap layer is a sacrificial or permanent cap layer;
   disposing a stack of sacrificial layers on top of the first cap layer;
   patterning an opening into a top sacrificial layer of the stack of sacrificial layers;
   etching the stack of sacrificial layers, the first cap layer, the metal liner, and the oxide liner according to a pattern of the opening, wherein an airgap pattern is formed in locations where the oxide liner is etched, wherein the airgap pattern leaves one or more exposed portions of the dielectric layer between the copper filled trenches;
   removing the stack of sacrificial layers;
   forming one or more airgaps between the copper filled trenches, wherein the one or more airgaps are formed by removing the one or more exposed portions of the dielectric layer between the copper filled trenches; and
   disposing a second cap layer on top of the one or more airgaps, the copper filled trenches, and portions of the oxide liner.

2. The method of claim 1, wherein disposing the stack of sacrificial layers on top of the first cap layer comprises disposing a bottom sacrificial layer on top of the first cap layer, disposing a middle sacrificial layer on top of the bottom sacrificial layer, and disposing the top sacrificial layer on top of the middle sacrificial layer.

3. The method of claim 2, wherein removing the stack of sacrificial layers comprises removing the bottom, middle, and top sacrificial layers.

4. The method of claim 2, wherein the bottom sacrificial layer is an organic planarization layer.

5. The method of claim 2, wherein the middle sacrificial layer is an anti-reflective coating.

6. The method of claim 2, wherein the top sacrificial layer is a photoresist layer.

7. The method of claim 1, wherein non-exposed portions of the dielectric layer remain after the airgap pattern is formed.

8. The method of claim 7, wherein the non-exposed portions of the dielectric layer support the second cap layer.

9. The method of claim 7, wherein the non-exposed portions of the dielectric layer have the oxide liner on top.

10. The method of claim 1, wherein the one or more airgaps have sidewalls formed of the oxide liner.

* * * * *